United States Patent
Bialas, Jr. et al.

(10) Patent No.: US 10,126,968 B2
(45) Date of Patent: Nov. 13, 2018

(54) EFFICIENT CONFIGURATION OF MEMORY COMPONENTS

(71) Applicant: International Business Machines Corporation, Armonk, NY (US)

(72) Inventors: John S. Bialas, Jr., South Burlington, VT (US); Stephen P. Glancy, Poughkeepsie, NY (US); Saravanan Sethuraman, Bangalore (IN); Jacob D. Sloat, Bloomington, MN (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 14/863,590

(22) Filed: Sep. 24, 2015

(65) Prior Publication Data

US 2017/0090804 A1    Mar. 30, 2017

(51) Int. Cl.
  *G06F 3/06* (2006.01)
  *G06F 12/0802* (2016.01)

(52) U.S. Cl.
  CPC .......... *G06F 3/0629* (2013.01); *G06F 3/0604* (2013.01); *G06F 3/0683* (2013.01); *G06F 12/0802* (2013.01); *G06F 2212/20* (2013.01)

(58) Field of Classification Search
  CPC .. G06F 12/0802; G06F 3/0683; G06F 3/0604; G06F 3/0629; G06F 12/08; G06F 3/06
  USPC .......................................... 711/105, 170, 154
  See application file for complete search history.

(56) References Cited

U.S. PATENT DOCUMENTS

| | | | |
|---|---|---|---|
| 7,831,769 B1 * | 11/2010 | Wen | G06F 3/0617 711/114 |
| 8,118,483 B2 | 2/2012 | Cox | |
| 8,639,874 B2 | 1/2014 | Maule et al. | |
| 8,799,565 B2 | 8/2014 | Ikarashi | |
| 8,869,007 B2 | 10/2014 | Cordero et al. | |

(Continued)

FOREIGN PATENT DOCUMENTS

| | | | | |
|---|---|---|---|---|
| EP | 1026575 A2 * | 8/2000 | ........... | G06F 3/0626 |
| EP | 1085425 A2 * | 3/2001 | ......... | G06F 9/44505 |

OTHER PUBLICATIONS

Anonymous "Method for a Fixed-Frame Pattern to Reduce Power Usage." An IP.com Prior Art Database Technical Disclosure, IPCOM000146475D, Feb. 13, 2007, 3 pp.

IBM "Method for Controlling Memory Power.", An IP.com Prior Art Database Technical Disclosure, IPCOM000186042D, Aug. 6, 2009, 6 pp.

*Primary Examiner* — Pierre Miche Bataille
(74) *Attorney, Agent, or Firm* — Patterson + Sheridan, LLP (57) ABSTRACT

In an example, a system includes a memory controller that includes a plurality of memory components. The system also includes a memory controller configured to receive a plurality of memory settings to be applied to the plurality of memory components. The memory controller is configured to, based on the received memory settings, transmit a first command to the plurality of memory components, the first command causing each memory component of the plurality of memory components to be configured to a first memory setting. The memory controller is configured to, based on the received memory settings, transmit a second command to a subset of the plurality of memory components after transmitting the first command, the second command causing each memory component of the subset to be configured to a second memory setting.

17 Claims, 6 Drawing Sheets

(56) References Cited

U.S. PATENT DOCUMENTS

| | | | |
|---|---|---|---|
| 9,251,053 B2* | 2/2016 | Hyun | G06F 12/0238 |
| 9,299,455 B2* | 3/2016 | Suzuki | G11C 16/3431 |
| 9,431,116 B2* | 8/2016 | Sun | G11C 16/10 |
| 9,437,254 B2* | 9/2016 | Pio | G11C 5/147 |
| 2003/0182403 A1* | 9/2003 | de Bonet | H04L 12/6418 |
| | | | 709/220 |
| 2005/0007835 A1* | 1/2005 | Lee | G11C 5/00 |
| | | | 365/189.12 |
| 2010/0091536 A1* | 4/2010 | Kim | G11C 5/02 |
| | | | 365/51 |
| 2013/0111122 A1* | 5/2013 | Song | G06F 13/1684 |
| | | | 711/105 |
| 2014/0149640 A1* | 5/2014 | Burke | G06F 12/02 |
| | | | 711/103 |
| 2014/0244922 A1* | 8/2014 | Bains | G11C 7/1072 |
| | | | 711/105 |
| 2014/0281119 A1* | 9/2014 | Hyun | G06F 12/0238 |
| | | | 711/102 |
| 2015/0081978 A1* | 3/2015 | Daly | G06F 12/0871 |
| | | | 711/133 |
| 2015/0294736 A1* | 10/2015 | Shim | G11C 29/1201 |
| | | | 365/96 |
| 2015/0324135 A1* | 11/2015 | Chan | G06F 3/061 |
| | | | 711/114 |
| 2016/0034359 A1* | 2/2016 | Cabrera | G06F 11/1464 |
| | | | 714/19 |
| 2016/0141044 A1* | 5/2016 | Sun | G11C 16/10 |
| | | | 365/185.11 |
| 2017/0177258 A1* | 6/2017 | Bates | G06F 3/0629 |

\* cited by examiner

EFFICIENT CONFIGURATION OF MEMORY COMPONENTS

I. FIELD OF THE DISCLOSURE

The present disclosure relates generally to memory commands to configure memory components.

II. BACKGROUND

A computer system may include one or more memory modules, such as dual in-line memory modules (DIMMs). DIMMs typically include memory components, such as dynamic random-access memory (DRAM) and/or memory buffers. Further, a computer system may include a memory controller to control communication between the memory components and other electronic components of the computer system. For instance, the memory controller may transmit one or more mode register set (MRS) memory commands to the memory components to control various signal timings, reference voltages, modes and/or other operations of the memory components.

In certain computer systems, the memory controller may be capable of individually configuring each memory component in a DIMM. For instance, the memory controller may receive and/or generate memory commands that configure each memory component to a respective setting. Processing and executing such commands consumes resources and increases the power draw of the computer system.

III. SUMMARY OF THE DISCLOSURE

A system includes a memory that includes a plurality of memory components. The memory may be in communication with a memory controller. The memory controller is configured to receive a plurality of memory settings to be applied to the plurality of memory components. The memory controller is further configured to, based on the received memory settings, transmit a first command to the plurality of memory components. The first command causes each memory component of the plurality of memory components to be configured to a first setting. The memory controller is configured to, based on the received memory settings, transmit a second command to a subset of the plurality of memory components after transmitting the first command. The second command causes each memory component of the subset to be configured to a second memory setting.

According to another embodiment, a method includes receiving, at a memory controller, a plurality of memory settings to be applied to a plurality of memory components. The method includes based on the received memory settings, transmitting a first command to the plurality of memory components. The first command causes each memory component of the plurality of memory components to be configured to a first memory setting. The method also includes based on the received memory settings, transmitting a second command to a subset of the plurality of memory components after transmitting the first command, where the second command causes each memory component of the subset to be configured to a second memory setting.

According to another embodiment, a computer-readable storage device includes computer-executable instructions, that when executed by at least one processor, causes the at least one processor to perform operations. The operations include receiving a plurality of memory settings to be applied to a plurality of memory components. The operations include, based on the received memory settings, transmitting a first command to the plurality of memory components. The first command causes each memory component of the plurality of memory components to be configured to a first setting. The operations also include, based on the received memory settings, transmitting a second command to a subset of the plurality of memory components after transmitting the first command, where the second command causes each memory component of the subset to be configured to a second memory setting.

V. DETAILED DESCRIPTION

In the present disclosure, a memory controller in a computer system may determine respective memory commands corresponding to each memory component of a plurality of memory components (e.g., DRAMs, memory buffers, and/or the like). For instance, the memory controller may receive the memory commands (e.g., as part of a data structure, such as array, that stores the memory commands). The memory commands may be used to configure corresponding memory components to respective settings, such as particular reference voltages, timings, and/or other operational settings associated with the memory components. For example, the settings may include any type of signal integrity setting, including but not limited to a nominal termination (RTT_NOM) setting, a park termination (RTT_PARK) setting, a write termination (RTT_WR) setting, an output driver impedance control setting, a reference voltage data signal training range (e.g., VREF DQ Training Range), a reference voltage data signal training value (e.g., VREF DQ Training Value), a Maximum Power Down Mode, a Low Power Auto Self Refresh, and a termination data strobe value (e.g., TDQS enable).

The memory controller may analyze the memory commands and group the memory components into one or more subsets, where each memory component in a subset is to be configured to a particular setting. For instance, the memory controller may determine a first subset and a second subset of the memory components, where each memory component in the first subset is to be configured to a first memory setting, and each memory component in the second subset is to be configured to a second memory setting. According to a particular embodiment, the first memory setting may correspond to a first reference voltage and the second memory setting may correspond to a second reference voltage. The first reference voltage and second reference voltages may be applied to their respective memory components to test the signal integrities of the memory components.

Further, the memory controller may determine whether a number of memory components corresponding to a particular subset satisfies a threshold. For example, the memory controller may determine that a number of memory components in the first subset satisfies the threshold, where the threshold represents greater than or equal to 75% of a total number of memory components in the plurality of memory components. It will be appreciated that other percentages, as well as other types of thresholds, may be used in alternative implementations.

Upon determining that the number of memory components in the first subset satisfies the threshold, the memory controller may issue or transmit a global memory command that configures each of the plurality of memory components to the first memory setting associated with the first subset. The global memory command may be a mode register set (MRS) command or a buffer control word (BCW) command that the memory controller broadcasts to the plurality of memory components. The MRS/BCW command may configure each of the memory components to the first setting associated with the first subset. The memory controller may then activate a memory component control mode that enables the memory controller to more precisely control the memory components using memory component commands. For instance, while the memory component control mode is activated, each memory component command transmitted by the memory controller may be capable of configuring one or more memory components. Thus, a single memory component command may be used to configure an individual memory component or to configure a subset of the plurality of memory components in the computer system. As such, while the memory component control mode is activated, certain memory components that were configured to the first memory setting by the MRS/BCW command may be selectively reconfigured to a different setting. In particular embodiments, the memory component control mode may be a Per DRAM Addressability (PDA) mode or a Per Buffer Addressability (PBA) mode.

While the memory component control mode is activated, the memory controller may, for the second subset of memory components, transmit a memory component command to configure each of the memory components in the second subset to the second memory setting associated with the second subset. According to a particular embodiment, the memory component command may be a PDA command or a PBA command. For instance, the memory controller may enter a PDA mode and transmit a PDA command to configure the memory components in the second subset to the second memory setting. Once the PDA command for the second subset has been transmitted, the memory controller may deactivate the memory component control mode.

Thus, the number of commands transmitted by the memory controller in the computer system may be controlled. For example, with respect to a group of memory components that are to be configured to the same setting, the memory controller may transmit a single memory command to configure the group instead of transmitting separate memory commands to configure each memory component of the group individually. Therefore, by controlling the number of commands transmitted by the memory controller, the amount of computing resources used by the computer system and the power draw of the computer system may be decreased.

Further, transmitting a global memory command (e.g., a global MRS/BCW command) may use less computing resources and less power compared to transmitting memory component commands in the memory component control mode (e.g., PDA mode or PBA mode). Thus, savings in computing resources and power usage may also be realized in situations where the memory controller issues a global memory command to configure a particular subset of memory components rather than activating a component control mode and transmitting a memory component command to configure the particular subset.

Figure 1:
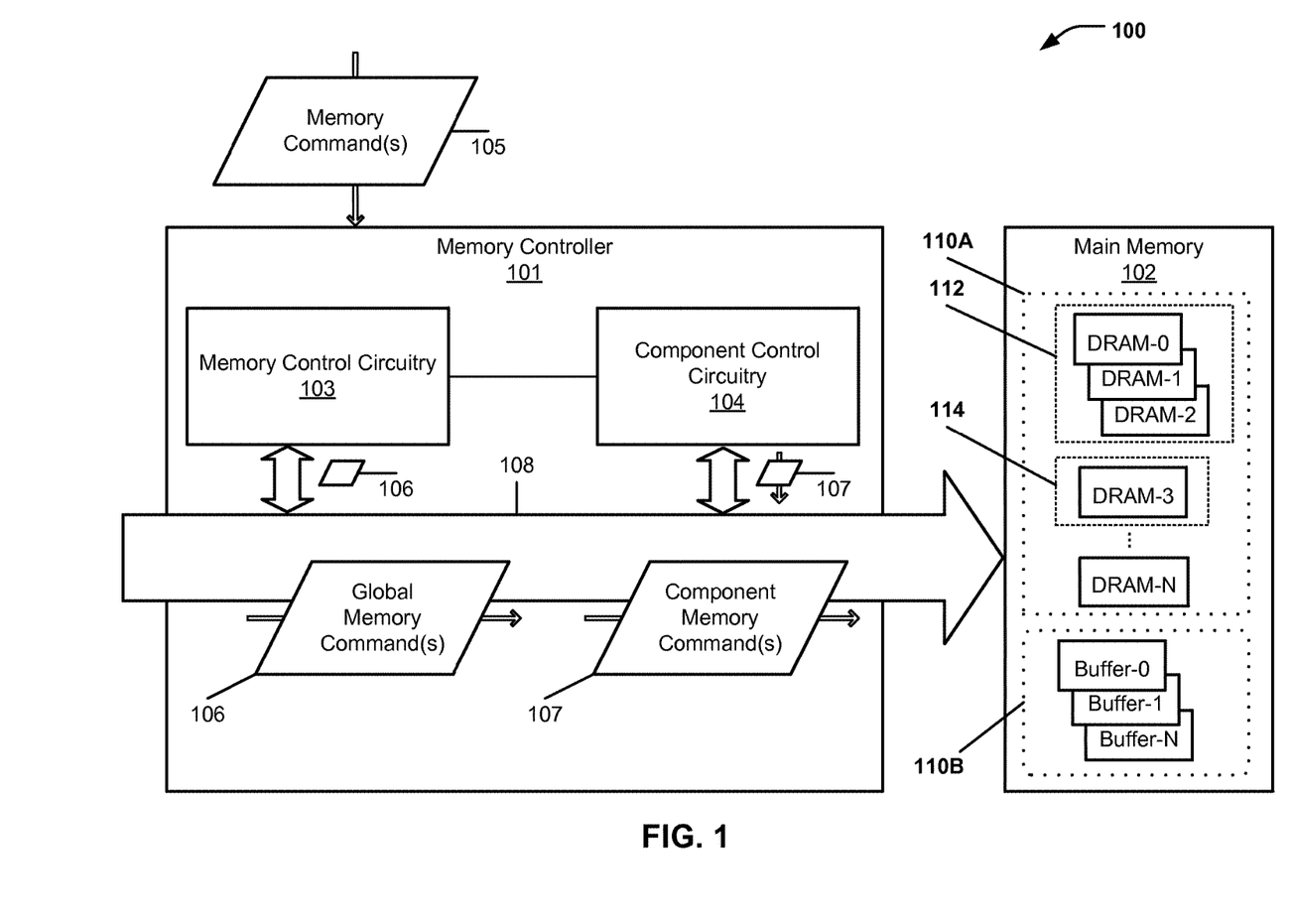
FIG. 1 is a block diagram showing a system for transmitting memory commands to configure memory components, according to one embodiment.

FIG. 1 illustrates a particular embodiment of a system 100 for transmitting memory commands to configure memory components. One or more memory commands 105 may be provided to, or in the alternative, generated by the memory controller 101. For instance, the memory commands 105 may be stored in a data structure (e.g., an array) that may be transmitted to a memory controller 101 by a processor (e.g., processor 714 illustrated in FIG. 7). Alternatively, the memory controller 101 may be configured to generate the array of memory commands 105, such as in response to one or more instructions received from a processor.

In the example of FIG. 1, the system 100 includes the memory controller 101 in communication with a main memory 102. The memory controller 101 may configure the main memory 102 in response to one or more memory commands 105. As noted above, the memory commands 105 may be generated by the memory controller 101, or the memory commands 105 may be received from other components in the system 100, such as a processor.

The memory controller 101 may include memory control circuitry 103 and component control circuitry 104. The memory control circuitry 103, as described in further detail below, may be configured to issue one or more global memory commands 106 to the main memory 102. A global memory command 106 may cause each memory component in the main memory 102, such as dynamic random access memories (DRAMs) 110A and/or memory buffers 110B, to be configured a particular memory setting. For example, a "global" memory command may cause each of the DRAMs 110A in main memory 102 to be configured to a particular reference voltage. The memory control circuitry 103 is described in further detail with reference to FIG. 2.

Further, the component control circuitry 104 may be activated in response to the memory commands 105. For instance, the memory control circuitry 103 may be configured to activate and/or deactivate the component control circuitry 104 in response to receiving the memory commands 105. When activated, the component control circuitry 104 may issue and/or transmit component memory commands 107 to one or more memory components (e.g., one or more of the DRAMs 110A and/or or one or more of the memory buffers 110B) to the main memory 102. According to a particular embodiment, component memory commands 107 may include Per DRAM Addressability (PDA) commands and/or Per Buffer Addressability (PBA) commands. In contrast to the global memory commands 106, the component memory commands 107 may be used to individually configure memory components and/or subsets of memory components to different settings. For instance, a first component memory command 107 may configure a first DRAM (e.g., denoted DRAM-0 in FIG. 1) to a first setting while a second component memory command 107 may configure a second DRAM (e.g., denoted DRAM-3 in FIG. 1) to a second setting. The global memory command(s) 106 and the component memory command(s) 107 may be transmitted to the main memory 102 via a memory bus 108.

Figure 2:
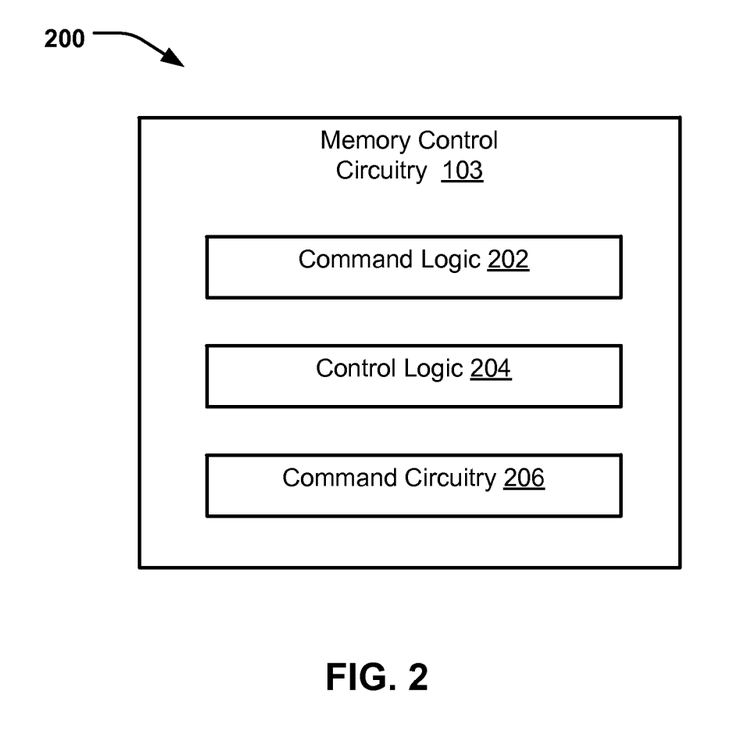
FIG. 2 is a block diagram showing a particular embodiment of memory control circuitry.

FIG. 2 illustrates a block diagram of the memory control circuitry 103 according to a particular embodiment. The memory control circuitry 103 may include command logic 202, control logic 204, and command circuitry 206.

According to a particular embodiment, the memory controller 101 may receive the memory commands 105. The memory commands 105 may be received by the memory controller 101 as an array of memory commands 105 although in other embodiments, the memory commands 105 may be stored in other types of data structures. Further, though the memory commands are described as being received by the memory controller 101, the memory commands 105 may also be obtained, hardwired to, and/or otherwise accessed by the memory controller 101. The array of memory commands 105 may indicate respective memory settings that are to be applied to one or more memory components (e.g., the DRAMs 110A) in the main memory 102. For example, each element of the array may indicate a memory component ID and a corresponding memory setting by which to configure a memory component 110A corresponding to the memory component ID. An example memory command array 301 is described in more detail with reference to FIG. 3. Further, it should be understood that while certain operations of the memory controller 101 may be described with reference to the DRAMs 110A, such operations may also be applied to the memory buffers 110B and/or a combination of the DRAMs 110A and memory buffers 110B.

Based on the array of memory commands 105, the command logic 202 of the memory control circuitry 103 may determine one or more subsets of the memory components 110A. In particular, the command logic 202 may determine the one or more subsets such that each subset of memory components 110A may be associated with (e.g., are to be configured to) a particular memory setting. For example, a first subset of memory components 112 may be associated with a first memory setting, and a second subset of the memory components 114 may be associated with a second memory setting. More particularly, the first subset 112 may include one or more memory components (e.g., DRAM-0, DRAM-1, and DRAM-2) that are to be configured to the first memory setting, and the second subset 114 may include one or more memory components (e.g., DRAM-3) that are to be configured to the second memory setting. It will be appreciated that the memory components 110A may be divided into any number of subsets and that each subset may include any number of memory components 110A. Additionally, as further described herein, the memory components of each subset may be configured to their corresponding memory setting using a single corresponding memory command. For instance, the memory components of the first subset 112 may be configured to the first memory setting using a first memory command, and the second subset 114 may be configured to the second memory setting using a second memory command. Thus, the command logic 202 may control the number of commands used to configure and/or program the memory components 110A-B.

The control logic 204 of the memory control circuitry 103 may determine a number of memory components corresponding to each subset. In particular, the control logic 204 may determine whether a number of memory components in a particular subset satisfies a threshold. According to a particular embodiment, the threshold may represent a percentage of the total number of memory components 110A-B in the main memory 102, although other types of thresholds may be used (e.g., the threshold may represent a particular number, a percentage of the total number of memory components that are to be configured by the array of memory commands 105, etc.). For example, the control logic 204 may determine that a first number of components in the first subset 112 satisfies the threshold, where the threshold is 50% of the total number of memory components 110A in the main memory 102. Upon determining that the first number of components satisfies the threshold, the control logic 204 may transmit, via the command circuitry 206, a global memory command 106 to the main memory 102. The global memory command 106 may cause each of the memory components 110A to be configured to the first memory setting associated with the first subset. Thus, the global memory command 106 may cause the memory components in both the first subset 112 and the second subset 114 to be configured to the first setting. According to a particular embodiment, the global memory command 106 may be a mode register set (MRS) command.

Subsequently, the control logic 204 may activate a component control mode, such as a PDA mode or PBA mode, in order to transmit component memory commands 107 (e.g., PDA commands and/or PBA commands) corresponding to each of the remaining subsets. For example, in order to activate the component control mode, the control logic 204 may be configured to activate the component control circuitry 104. For each of the remaining subsets, the control logic 204 may instruct and/or otherwise cause the component control circuitry 104 to transmit a corresponding component memory command 107 to the main memory 102 to configure the memory components in the remaining subset to the particular memory setting corresponding to the remaining subset. For instance, the control logic 204 may cause the component control circuitry 104 to transmit a component memory command to the main memory 102 to configure the memory components in the second subset 114 to the second memory setting. Upon transmitting the component memory commands 107 corresponding to the second subset 114, the control logic 204 may deactivate the component control mode (e.g., the PDA mode and/or the PBA mode), such as by deactivating the component control circuitry 104.

Thus, operations of the memory controller 101 may control the number of memory commands used to configure the main memory 102, thereby increasing available computing resources of the system 100 and decreasing the power draw of the system 100. For instance, rather than transmitting a separate memory command for each command stored in the array of memory commands 105, the memory controller 101 may determine, from the array, one or more subsets of the memory components 110A-B, where components within each subset are to be configured to a common memory setting. For each particular subset, the memory controller 101 may transmit a single memory command to configure the memory components in the particular subset to the particular subset's corresponding memory setting. Additionally, transmitting global memory commands 106 may be associated with less power draw and less computing resources than transmitting component memory commands 107. For example, the component control circuitry 104 may remain deactivated when the memory controller 101 transmits a global memory command 106. Therefore, in situations where the memory controller 101 is able to configure the main memory 102 using a global memory command 106, further savings in computing resources and power draw of the system 100 may be realized by transmitting the global memory command 106 instead of another memory component command 107.

Figure 3:
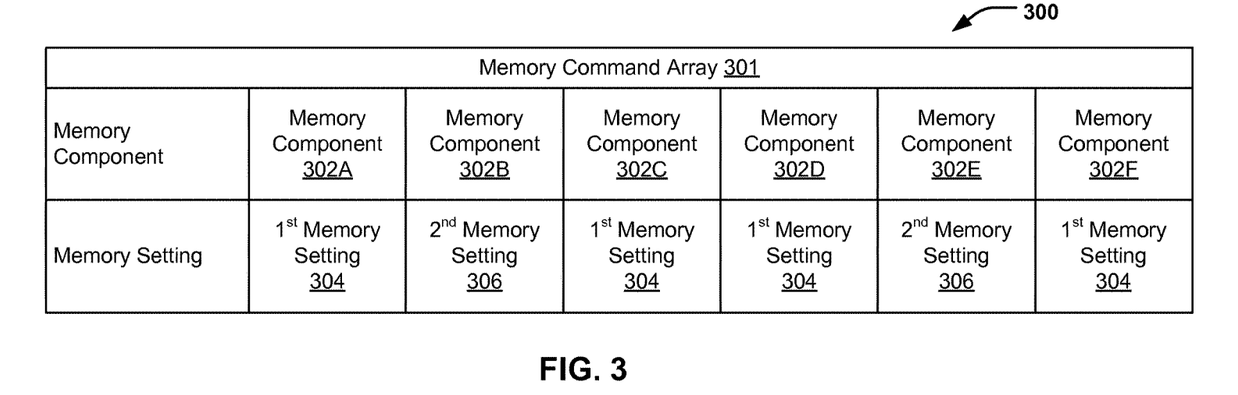
FIG. 3 is a block diagram showing a particular embodiment of a memory command array.

FIG. 3 illustrates a block diagram 300 of a memory command array 301 according to a particular embodiment. The memory command array 301 may indicate a plurality of memory components (e.g., one or more of the memory components 110A or 110B) that are to be configured to their respective memory settings (e.g., memory commands 105). In FIG. 3, the memory command array 301 indicates that memory component 302A is to be configured to a first memory setting 304, memory component 302B is to be configured to a second memory setting 306, memory component 302C is to be configured to the first memory setting 304, memory component 302D is to be configured to the first memory setting 304, memory component 302E is to be configured to the second memory setting 306, and memory component 302F is to be configured to the first memory setting 304.

Figure 4:
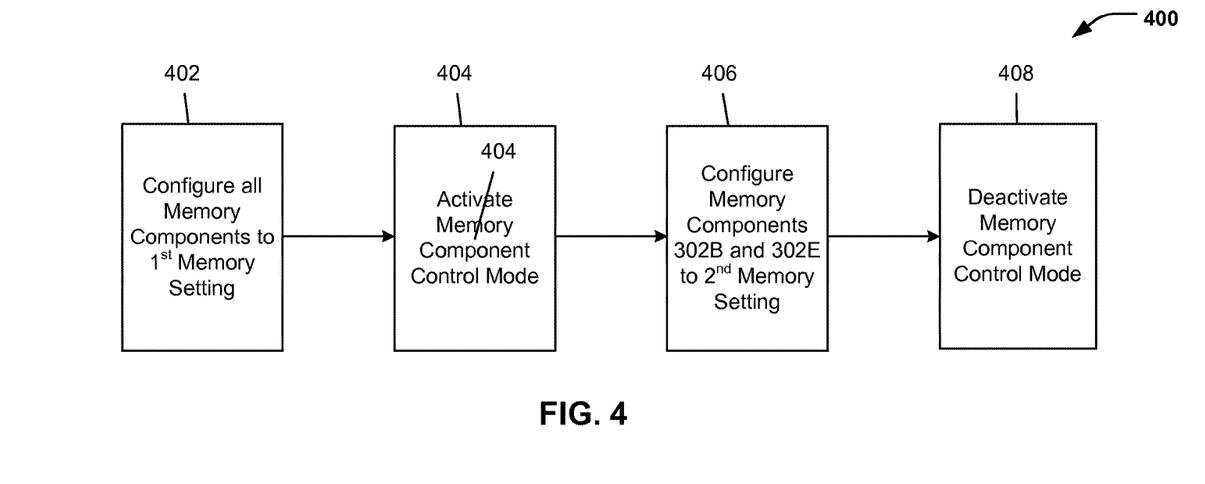
FIG. 4 is a flow diagram showing a particular embodiment of a method for transmitting memory commands to configure memory components.

FIG. 4 illustrates a flow diagram of a method 400 for transmitting one or memory commands in response receiving the memory command array 301 of FIG. 3. For instance, the method 400 may be performed by the memory controller 101, such as after grouping the memory components 302A-F in the memory command array 301 into different subsets based on their respective memory settings (e.g., the first memory setting 304 or the second memory setting 306). At 402, the memory controller 101 may transmit a global memory command (e.g., global memory command 106), such as via the memory control circuitry 103, to the memory components 302A-F. As a result of the global memory command, each of the memory components 302A-F may be configured to the first memory setting 304.

At 404, the memory controller 101 may activate a component control mode (e.g., a PDA mode or a PBA mode). For instance, as described above, the control logic 204 of the memory control circuitry 103 may activate the component control circuitry 104 of the memory controller 101. At 406, the memory controller 101 may configure memory component 302B and memory component 302E to the second memory setting 306 by transmitting a single component memory command (e.g., component memory command 107). For instance, the control logic 204 of the memory control circuitry 103 may cause the component control circuitry 104 to transmit the single component memory command to the main memory 102.

Figure 5:
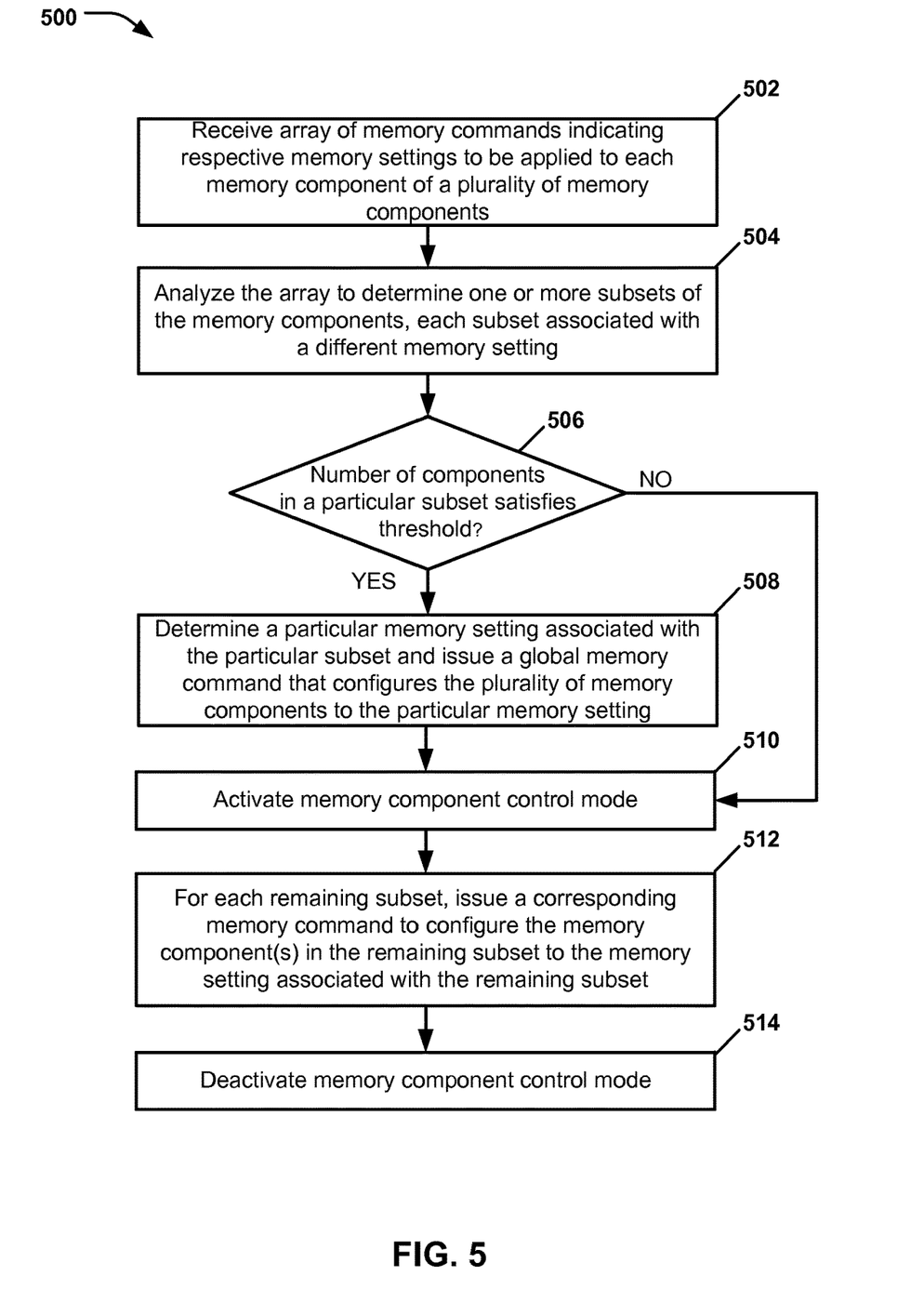
FIG. 5 is a flow diagram showing another particular embodiment of a method for transmitting memory commands to configure memory components.

FIG. 5 illustrates a particular embodiment of a method 500 of transmitting memory commands to configure memory components. The method 500 may include receiving an array of memory commands indicating respective memory settings to be applied to each memory component of a plurality of memory components at 502. For example, with reference to FIG. 1, the memory controller 101 may receive an array of the memory commands 105 that indicate respective settings for the memory components 110A-B. At 504, the method 500 may include analyzing the array to determine one or more subsets of the memory components, where each subset is associated with a different memory setting. For example, with reference to FIG. 1 and FIG. 2, the command logic 202 of the memory control circuitry 103 may determine the subsets 112, 114.

At 506, the method 500 may include determining whether a number of components in a particular subset satisfies a threshold. If so, the method 500 may proceed to 508. If not, the method 500 may proceed directly to 510. For instance, with reference to FIG. 1 and FIG. 2, the control logic 204 of the memory control circuitry 103 may determine respective numbers of memory components 110A-B corresponding to the subsets 112, 114. The control logic 204 may further compare the respective numbers with the threshold to identify whether a particular number corresponding to a particular subset satisfies the threshold.

At 508, the method 500 may include determining a particular memory setting associated with the particular subset and transmitting a global memory command that configures each of the plurality of memory components to the particular memory setting. For example, with reference to FIG. 1 and FIG. 2, the control logic 204 may cause the command circuitry 206 to transmit the global memory command 106 to the main memory 102 to configure each of the memory components (e.g., each of the DRAMS 110A and/or each of the memory buffers 110B) to the particular memory setting.

At 510, the method 500 may include activating a memory component control mode. For example, with reference to FIG. 1 and FIG. 2, the control logic 204 may activate the component control circuitry 104. At 512, the method 500 may include transmitting, for each remaining subset of memory components, a corresponding memory command to configure the memory components in the remaining subset to the memory setting associated with the remaining subset. For example, the control logic 204 may cause the component control circuitry 104 to transmit a corresponding component memory command 107 for each of the remaining subsets. At 514, the method 500 may include deactivating the memory component control mode. For instance, the control logic 204 may deactivate the component control circuitry 104.

Figure 6:
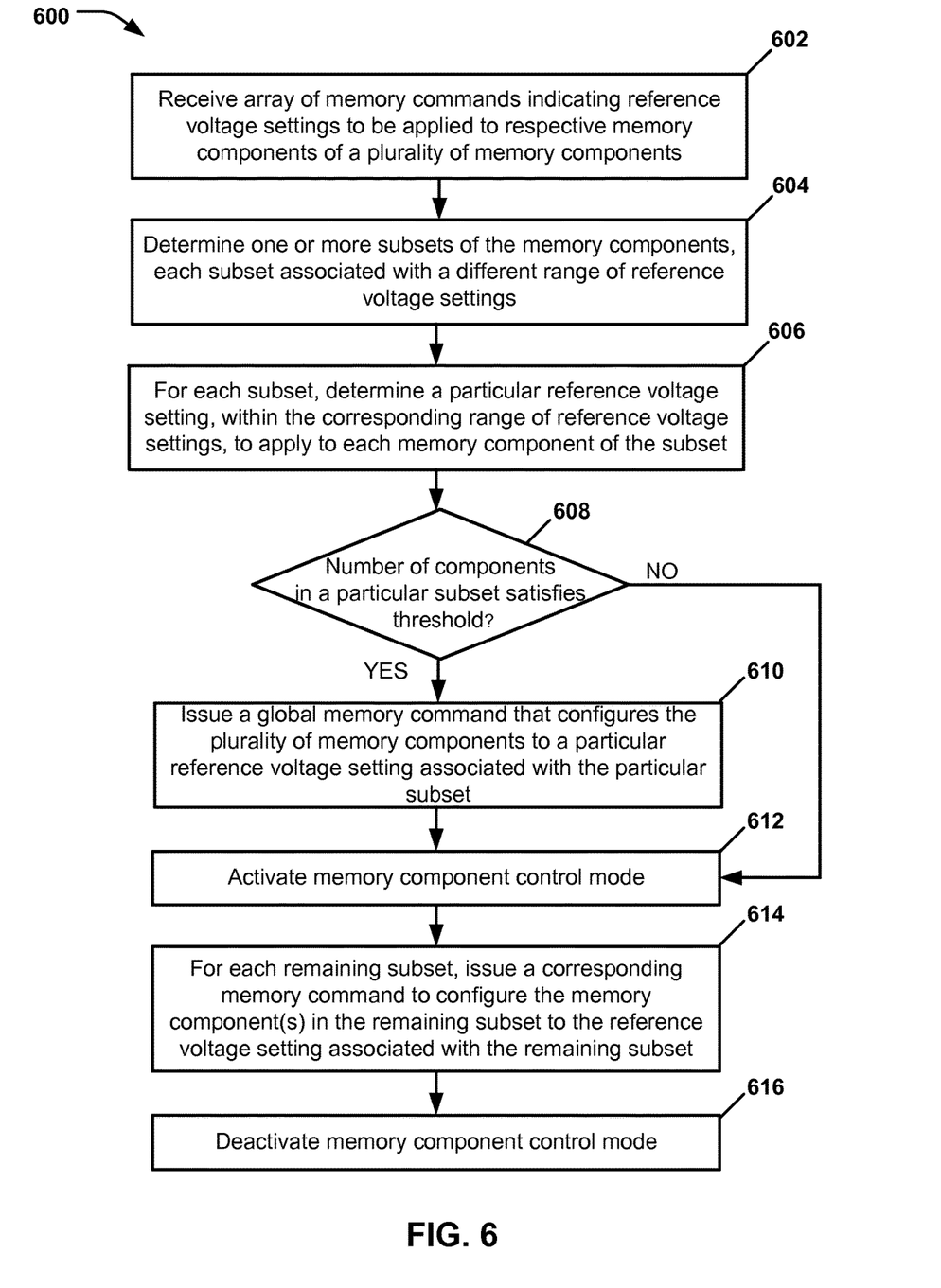
FIG. 6 is a flow diagram showing another particular embodiment of a method for transmitting memory commands to configure memory components.

FIG. 6 illustrates another particular embodiment of a method 600 of transmitting memory commands to configure memory components. The method 600 may include receiving an array of memory commands indicating reference voltage settings to be applied to respective memory components of a plurality of memory components at 602. For example, with reference to FIG. 1, the memory controller 101 may receive an array of the memory commands 105 that indicate the reference voltage settings for the respective memory components 110A-B.

At 604, the method 600 may include determining one or more subsets of the memory components, where each subset is associated with a different range of reference voltage settings. For instance, with reference to FIG. 1 and FIG. 2, the memory controller 101 may determine (e.g., via the command logic 202) the different ranges of reference voltage settings based on statistical models of relationships between timing margins and test reference voltages associated with the plurality of memory components. More particularly, the statistical model may indicate, for a particular memory component, a range of reference voltage settings that may be applied to the particular memory component while still satisfying a signal integrity threshold. According to an embodiment, the statistical model may be stored in a storage device (such as non-volatile memory 860 and/or data storage 824 of FIG. 8) and may be provided to the memory controller 101, such as by a processor.

At 606, the method 600 may include determining, for each subset, a particular reference voltage setting, within the corresponding range of reference voltage settings, to apply to each memory component of the subset. For instance, with reference to FIG. 1 and FIG. 2, the memory controller 101 may determine (e.g., via the command logic 202), for a particular subset a particular reference voltage setting to apply to the memory components in the particular subset. Further, the particular reference voltage setting determined by the memory controller 101 may be within the particular range of reference voltage settings associated with the particular subset. Thus, even though the particular subset may include memory components associated with different corresponding reference voltage settings indicated by the memory commands, the memory controller 101 may determine a single particular reference voltage setting to apply to every memory component in the particular subset. Further, the memory controller 101 may determine the particular reference voltage setting based on the statistical models of relationships between timing margins and test reference voltages associated with the plurality of memory components. For instance, based on the statistical models, the memory controller 101 may determine that the memory components of the particular subset may satisfy a signal integrity threshold when the particular reference voltage setting is applied.

At 608, the method 600 may include determining whether a number of components in a particular subset satisfies a threshold. If so, the method 600 may proceed to 610. If not, the method 600 may proceed directly to 612. For instance, with reference to FIG. 1 and FIG. 2, the control logic 204 of the memory control circuitry 103 may determine respective numbers of memory components 110A-B corresponding to each subset. The control logic 204 may further compare the respective numbers with the threshold to identify whether a particular number corresponding to a particular subset satisfies the threshold.

At 610, the method 600 may include transmitting a global memory command that configures the plurality of memory components to a particular reference voltage setting associated with the particular subset. For example, with reference to FIG. 1 and FIG. 2, the control logic 204 may cause the command circuitry 206 to transmit the global memory command 106 to the main memory 102 to configure each of the memory components (e.g., DRAMS 110A and/or memory buffers 110B) to the particular reference voltage setting.

At 612, the method 600 may include activating a memory component control mode. For example, with reference to FIG. 1 and FIG. 2, the control logic 204 may activate the component control circuitry 104. At 614, the method 600 may include transmitting, for each remaining subset of memory components, a corresponding memory command to configure the memory components in the remaining subset to the particular reference voltage setting associated with the remaining subset. For example, the control logic 204 may cause the component control circuitry 104 to transmit a corresponding component memory command 107 for each of the remaining subsets. At 616, the method 600 may include deactivating the memory component control mode. For instance, the control logic 204 may deactivate the component control circuitry 104.

Figure 7:
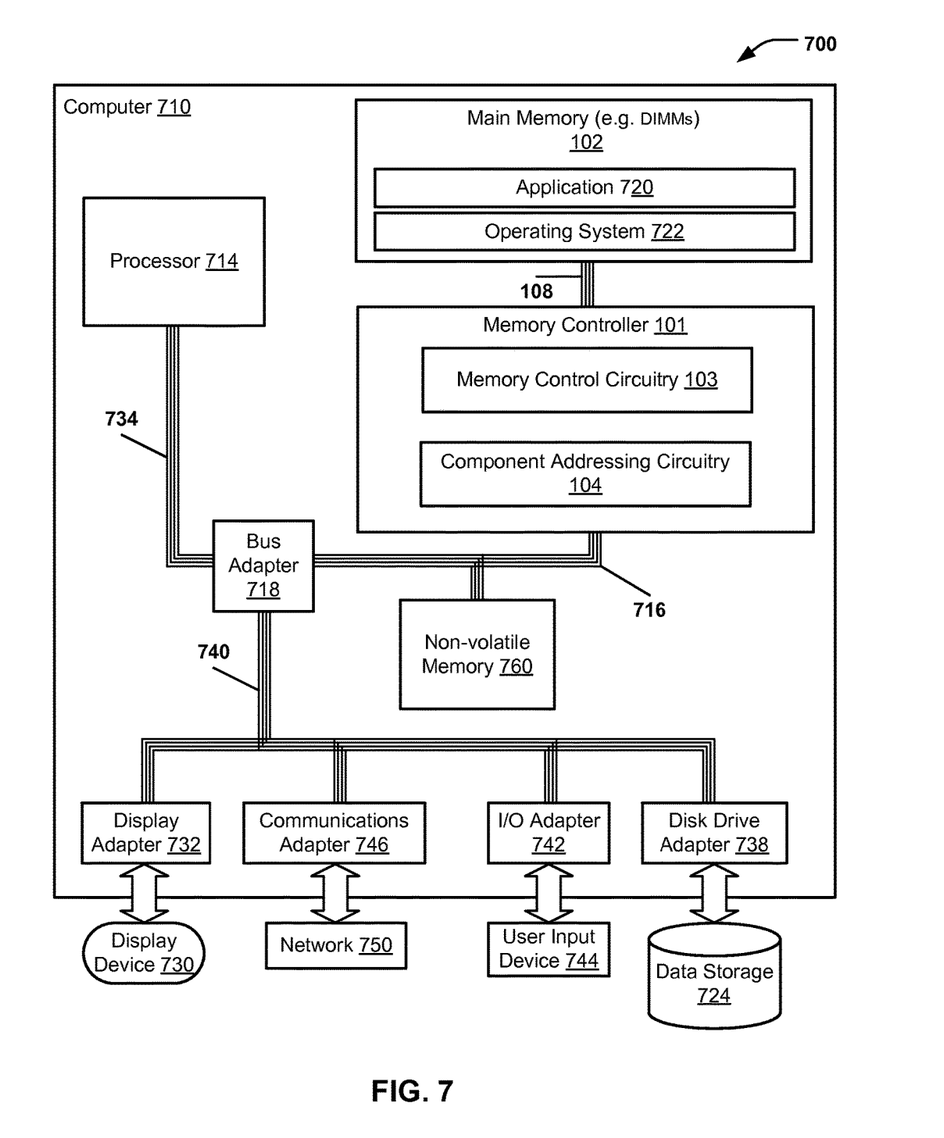
FIG. 7 is a block diagram showing a general computing system for transmitting memory commands to configure memory components.

Referring to FIG. 7, an illustrative system 700 including a computer 710 is shown. The computer 710 may be an implementation of the computing system 100 of FIG. 1. The computer 710 includes at least one computer processor (CPU) 714 as well as main memory 102, a memory controller 101, and a non-volatile memory 760. The main memory 102 is connected through a memory bus 708 to the memory controller 101. The memory controller 101 and the non-volatile memory 760 are connected through a memory bus 108 and a bus adapter 718 to the processor 714 through a processor bus 734.

Stored at the memory 102 is an application 720 that may be a module of user-level computer program instructions for carrying out particular tasks (e.g., the operations described with respect to the monitoring commands and setting values, etc.). Also stored at the main memory 102 is an operating system 722. Operating systems include, but are not limited to, UNIX® (a registered trademark of The Open Group), Linux® (a registered trademark of Linus Torvalds), Windows® (a registered trademark of Microsoft Corporation, Redmond, Wash., United States), AIX® (a registered trademark of International Business Machines (IBM) Corp., Armonk, N.Y., United States) i5/OS® (a registered trademark of IBM Corp.), and others as will occur to those of skill in the art. The operating system 722 and the application 720 in the example of FIG. 7 are shown in the main memory 102, but components of the aforementioned software may also, or in addition, be stored at non-volatile memory (e.g., on data storage, such as data storage 724 and/or the non-volatile memory 760).

The computer 710 includes a disk drive adapter 738 coupled through an expansion bus 740 and the bus adapter 718 to the processor 714 and other components of the computer 710. The disk drive adapter 738 connects non-volatile data storage to the computer 710 in the form of the data storage 724 and may be implemented, for example, using Integrated Drive Electronics ("IDE") adapters, Small Computer System Interface ("SCSI") adapters, Serial Attached SCSI ("SAS") adapters, and others as will occur to those of skill in the art. Non-volatile computer memory also may be implemented as an optical disk drive, electrically erasable programmable read-only memory (so-called "EEPROM" or "Flash" memory), RAM drives, and other devices, as will occur to those of skill in the art. In a particular embodiment, the data storage 824 may store the data and information described herein.

The computer 710 also includes one or more input/output ("I/O") adapters 742 that implement user-oriented input/output through, for example, software drivers and computer hardware for controlling input and output to and from user input devices 744, such as keyboards and mice. In addition, the computer 710 includes a communications adapter 746 for data communications with a data communications network 750. The data communications may be carried out serially through Recommended Standard 232 (RS-232) connections (sometimes referred to as "serial" connections), through external buses such as a Universal Serial Bus ("USB"), through data communications networks such as internet protocol (IP) data communications networks, and in other ways as will occur to those of skill in the art. The communications adapter 746 implements the hardware level of data communications through which one computer sends data communications to another computer, directly or through a data communications network. Examples of the communications adapter 746 suitable to use in the computer 710 include, but are not limited to, modems for wired dial-up communications, Ethernet (Institute of Electrical and Electronics Engineers (IEEE) 802.3) adapters for wired network communications, and IEEE 802.11 adapters for wireless network communications. The computer 710 also includes a display adapter 732 that facilitates data communication between the bus adapter 718 and a display device 730, enabling the application 720 to visually present output on the display device 730.

Particular embodiments described herein may take the form of an entirely hardware embodiment, an entirely software embodiment, or an embodiment containing both hardware and software elements. In a particular embodiment, the disclosed methods are implemented in software that is embedded in processor readable storage medium and executed by a processor that includes but is not limited to firmware, resident software, microcode, etc.

Further, embodiments of the present disclosure, may take the form of a computer program product accessible from a computer-usable or computer-readable storage medium providing program code for use by or in connection with a computer or any instruction execution system. For the purposes of this description, a computer-usable or computer-readable storage medium can be any apparatus that can tangibly embody a computer program and that can contain, store, communicate, propagate, or transport the program for use by or in connection with the instruction execution system, apparatus, or device.

In various embodiments, the medium can include an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and digital versatile disk (DVD).

A data processing system suitable for storing and/or executing program code may include at least one processor coupled directly or indirectly to memory elements through a system bus. The memory elements can include local memory employed during actual execution of the program code, bulk storage, and cache memories that may provide temporary or more permanent storage of at least some program code in order to reduce the number of times code must be retrieved from bulk storage during execution.

Input/output or I/O devices (including but not limited to keyboards, displays, pointing devices, etc.) can be coupled to the data processing system either directly or through intervening I/O controllers. Network adapters may also be coupled to the data processing system to enable the data processing system to become coupled to other data processing systems or remote printers or storage devices through intervening private or public networks. Modems, cable modems, and Ethernet cards are just a few of the currently available types of network adapters.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. A method, comprising:
receiving, at a memory controller, a plurality of memory settings to be applied to a plurality of memory components;
based on the received memory settings, transmitting a first command to the plurality of memory components, the first command causing each memory component of the plurality of memory components to be configured to a first memory setting;
based on the received memory settings, transmitting a second command to a subset of the plurality of memory components after transmitting the first command, the second command causing each memory component of the subset to be configured to a second memory setting; and
comparing the plurality of memory settings to determine a number of memory components of a second subset of the plurality of memory components, wherein each memory component of the second subset is associated with the first memory setting, and wherein the first command is transmitted in response to the number of memory components of the second subset satisfying a threshold,
wherein to transmit the second command, the memory controller is further configured to transmit the second command to the subset while a memory component control mode is activated.

2. The method of claim 1, wherein each memory component of the subset is associated with a corresponding reference voltage setting that is within a voltage range, and the second memory setting comprises a particular reference voltage setting that is within the voltage range.

3. The method of claim 1, wherein the plurality of memory settings comprise a plurality of reference voltage settings.

4. The method of claim 1, wherein transmitting the second command comprises:
activating the memory component control mode; and
transmitting the second command to the subset while the memory component control mode is activated; and
deactivating the memory component control mode after transmitting the second command.

5. A system, comprising:
a memory comprising a plurality of memory components; and
a memory controller configured to:
receive a plurality of memory settings to be applied to the plurality of memory components;
based on the received memory settings, transmit a first command to the plurality of memory components, the first command causing each memory component of the plurality of memory components to be configured to a first memory setting; and
based on the received memory settings, transmit a second command to a subset of the plurality of memory components after transmitting the first command, the second command causing each memory component of the subset to be configured to a second memory setting;
wherein to transmit the second command, the memory controller is further configured to:
activate a memory component control mode;
transmit the second command to the subset while the memory component control mode is activated; and
deactivate the memory component control mode after transmitting the second command.

6. The system of claim 5, wherein the memory controller is further configured to:
compare the plurality of memory settings to determine a number of memory components of a second subset of the plurality of memory components, wherein each memory component of the second subset is associated with the first memory setting, and wherein the first command is transmitted in response to the number of memory components of the second subset satisfying a threshold.

7. The system of claim 6, wherein the threshold corresponds to a percentage of a total number of the plurality of memory components.

8. The system of claim 5, wherein the plurality of memory settings comprise a plurality of reference voltage settings.

9. The system of claim 5, wherein each memory component of the subset is associated with a corresponding reference voltage setting that is within a voltage range, and the second memory setting comprises a particular reference voltage setting that is within the voltage range.

10. The system of claim 5, wherein the first command comprises a global memory command configured to apply the first memory setting to each memory component of the plurality of memory components.

11. The system of claim 10, wherein the first command is a mode register set (MRS) command or a buffer control word (BCW) command.

12. The system of claim 5, wherein the second command comprises a memory component command configured to apply the second memory setting to one or more memory components of the plurality of memory components.

13. The system of claim 12, wherein the second command is a Per Dynamic Random Access Memory (PDA) command or a Per Buffer Addressability (PBA) command.

14. The system of claim 5, wherein the second command is a Per Dynamic Random Access Memory (PDA) command or a Per Buffer Addressability (PBA) command, and the memory component control mode is a PDA mode or a PBA mode.

15. The system of claim 5, wherein the plurality of memory components correspond to double date rate 4 (DDR4) synchronous dynamic random access memories (SDRAMs).

16. A non-transitory computer readable storage device storing computer-executable instructions, that when executed by at least one processor, causes the at least one processor to perform operations comprising:

receiving, at a memory controller, a plurality of memory settings to be applied to a plurality of memory components;

based on the received memory settings, transmitting a first command to the plurality of memory components, the first command causing each memory component of the plurality of memory components to be configured to a first memory setting;

based on the received memory settings, transmitting a second command to a subset of the plurality of memory components after transmitting the first command, the second command causing each memory component of the subset to be configured to a second memory setting; and comparing the plurality of memory settings to determine a number of memory components of a second subset of the plurality of memory components, wherein each memory component of the second subset is associated with the first memory setting, and wherein the first command is transmitted in response to the number of memory components of the second subset satisfying a threshold;

wherein to transmit the second command, the memory controller is further configured to transmit the second command to the subset while a memory component control mode is activated.

17. The computer readable storage device of claim 16, wherein transmitting the second command comprises:

activating a memory component control mode; and deactivating the memory component control mode after transmitting the second command.

* * * * *